United States Patent
Lu et al.

(10) Patent No.: US 10,915,396 B1
(45) Date of Patent: Feb. 9, 2021

(54) SOFT-INPUT SOFT-OUTPUT COMPONENT CODE DECODER FOR GENERALIZED LOW-DENSITY PARITY-CHECK CODES

(71) Applicant: SK hynix Inc., Icheon-Si (KR)

(72) Inventors: Xuanxuan Lu, San Jose, CA (US); Fan Zhang, San Jose, CA (US); Chenrong Xiong, San Jose, CA (US); Meysam Asadi, San Jose, CA (US)

(73) Assignee: SK hynix Inc., Icheon-si (KR)

( * ) Notice: Subject to any disclaimer, the term of this patent is extended or adjusted under 35 U.S.C. 154(b) by 19 days.

(21) Appl. No.: 16/516,110

(22) Filed: Jul. 18, 2019

(51) Int. Cl.
  *G06F 11/10* (2006.01)
  *G11C 29/52* (2006.01)
  *H03M 13/11* (2006.01)

(52) U.S. Cl.
  CPC .......... *G06F 11/1068* (2013.01); *G11C 29/52* (2013.01); *H03M 13/1125* (2013.01)

(58) Field of Classification Search
  CPC . G06F 11/1068; G11C 29/52; H03M 13/1125
  See application file for complete search history.

(56) References Cited

U.S. PATENT DOCUMENTS

| | | | | |
|---|---|---|---|---|
| 5,930,272 A * | 7/1999 | Thesling | ........... | H03M 13/1505 375/262 |
| 6,856,660 B1 * | 2/2005 | Watanabe | ........ | G11B 20/10009 375/363 |
| 7,765,458 B1 * | 7/2010 | Yang | ................. | H03M 13/4138 714/795 |
| 2008/0008272 A1 * | 1/2008 | Yang | ................. | H04L 25/03203 375/341 |
| 2009/0287983 A1 * | 11/2009 | Truong | ............. | H03M 13/1575 714/785 |
| 2018/0212625 A1 * | 7/2018 | Brueggen | ......... | H03M 13/6561 |
| 2018/0226994 A1 * | 8/2018 | Brueggen | ......... | H03M 13/6516 |
| 2019/0199377 A1 * | 6/2019 | Medard | ................. | H04L 1/0045 |
| 2019/0253078 A1 * | 8/2019 | Goettfert | ........... | H03M 13/1575 |
| 2020/0119748 A1 * | 4/2020 | Lucarelli | ........... | H03M 13/2906 |

OTHER PUBLICATIONS

Muller, B. et al., Low Complexity Soft-Input Soft-Output Hamming Decoder, University of the Federal Armed Forces.
Mahran, A., Serial Concatenation of Reed-Solomon Code and an Inner Soft-Decoding Hamming Code, Aerospace Sciences & Aviation Technology, ASAT-16-163-CM, May 2015.

* cited by examiner

*Primary Examiner* — Kyle Vallecillo
(74) *Attorney, Agent, or Firm* — Perkins Coie LLP (57) ABSTRACT

Disclosed are devices, systems and methods for improved decoding of a binary linear code. An example method includes receiving a noisy codeword; computing a syndrome based on the noisy codeword; identifying N error patterns that correspond to the syndrome; selecting M error patterns from the N error patterns, wherein $M \leq N$ are positive integers, wherein a distance between a codeword corresponding to each of the M error patterns and the noisy codeword is less than a distance between a codeword corresponding to any other error pattern and the noisy codeword, and wherein the distance excludes a Hamming distance; modifying the noisy codeword based on each of the M error patterns one-at-a-time; and decoding the modified noisy codeword one-at-a-time until a successful decoding is achieved.

22 Claims, 8 Drawing Sheets

SOFT-INPUT SOFT-OUTPUT COMPONENT CODE DECODER FOR GENERALIZED LOW-DENSITY PARITY-CHECK CODES

TECHNICAL FIELD

This patent document generally relates to non-volatile memory devices, and more specifically, to error correction in non-volatile memory devices.

BACKGROUND

Data integrity is an important feature for any data storage device and data transmission. Use of strong error-correction codes (ECCs) is recommended for various types of data storage devices including NAND flash memory devices.

Solid-state drives (SSDs) use multi-level NAND flash devices for persistent storage. However, the multi-level NAND flash devices can be inherently unreliable and generally need to use ECCs to allow dramatic increase in data reliability at the expense of extra storage space for ECC parity bits. There is a demand for increasingly efficient ECCs control mechanisms that provide the most data protection for the least parity and complexity requirements.

SUMMARY

Embodiments of the disclosed technology relate to methods, devices and systems for soft-input soft-output (SISO) decoding of component codes of a generalized low-density parity-check (GLDPC) code. The methods and devices described in the present document advantageously, among other features and benefits, enable low-complexity implementations of the SISO algorithm for the component codes of the GLDPC.

In an example aspect, a method for improved decoding of a binary linear code includes receiving a noisy codeword; computing a syndrome based on the noisy codeword; identifying N error patterns that correspond to the syndrome; selecting M error patterns from the N error patterns, wherein M≤N are positive integers, wherein a distance between a codeword corresponding to each of the M error patterns and the noisy codeword is less than a distance between a codeword corresponding to any other error pattern and the noisy codeword, and wherein the distance excludes a Hamming distance; modifying the noisy codeword based on each of the M error patterns one-at-a-time; and decoding the modified noisy codeword one-at-a-time until a successful decoding is achieved.

In another example aspect, the above-described method may be implemented by a video encoder apparatus or a video decoder apparatus that comprises a processor.

In yet another example aspect, these methods may be embodied in the form of processor-executable instructions and stored on a computer-readable program medium.

The subject matter described in this patent document can be implemented in specific ways that provide one or more of the following features.

DETAILED DESCRIPTION

Generalized low-density parity-check (GLDPC) codes are constructed by replacing some or all of the single parity-check (SPC) constraint nodes in the Tanner graph of a conventional LDPC code by more powerful generalized constraint nodes, where the generalized constraint nodes can correspond to any linear block code with block length K. The sub-code associated with each generalized constraint node is referred to as a component code. GLDPC codes are suitable for low complexity message passing decoding like conventional LDPC codes, and have many potential advantages including a large minimum distance, good iterative decoding performance, and fast decoding convergence. Examples of component codes that are widely used include Hamming codes.

FIGS. 1-6 overview a non-volatile memory system in which embodiments of the disclosed technology may be implemented.

Figure 1:
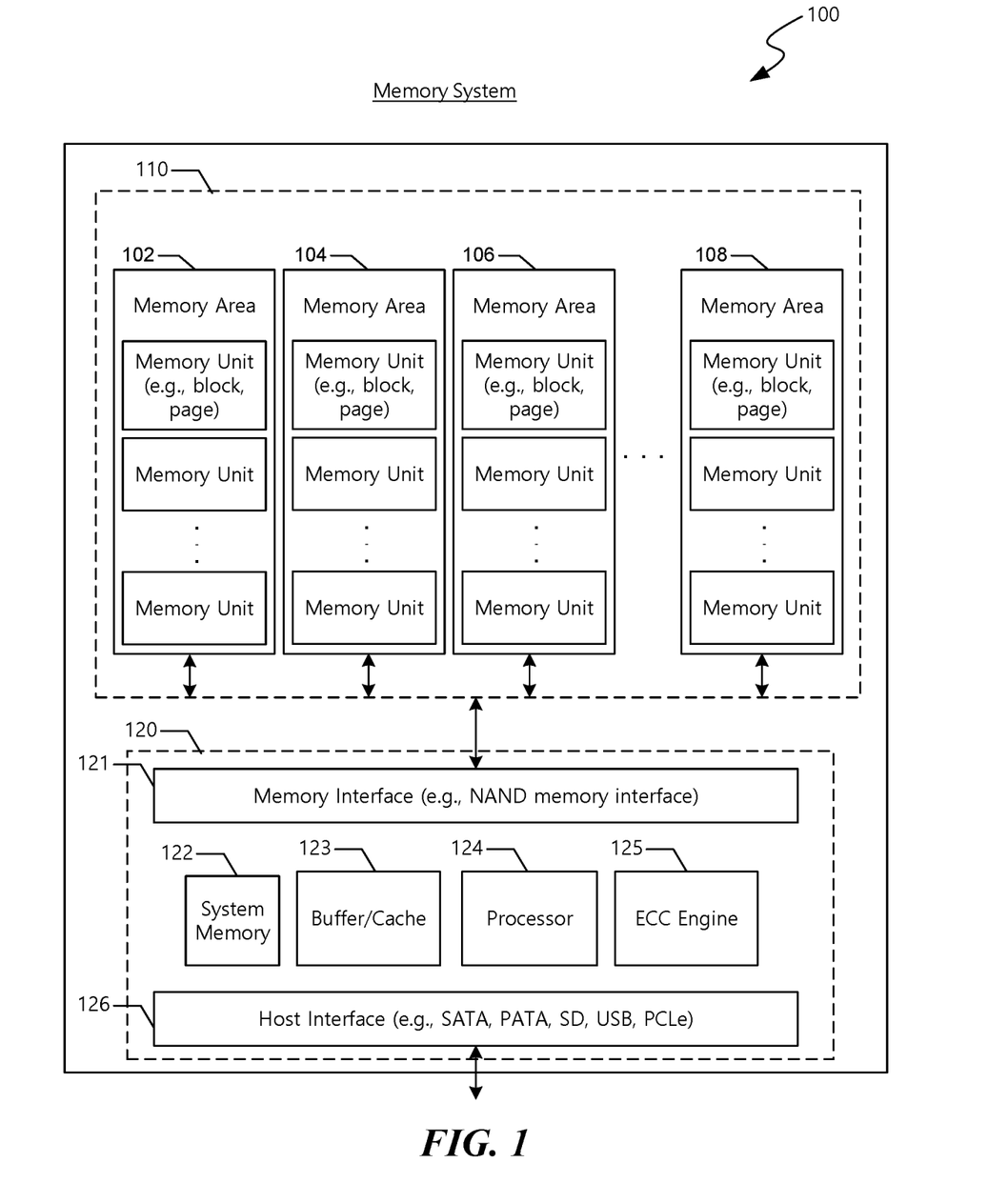
FIG. 1 illustrates an example of a memory system.

FIG. 1 is a block diagram of an example of a memory system 100 implemented based on some embodiments of the disclosed technology. The memory system 100 includes a memory module 110 that can be used to store information for use by other electronic devices or systems. The memory system 100 can be incorporated (e.g., located on a circuit board) in other electronic devices and systems. Alternatively, the memory system 100 can be implemented as an external storage device such as a USB flash drive and a solid-state drive (SSD).

The memory module 110 included in the memory system 100 can include memory areas (e.g., memory arrays) 102, 104, 106, and 108. Each of the memory areas 102, 104, 106, and 108 can be included in a single memory die or in multiple memory dice. The memory die can be included in an integrated circuit (IC) chip.

Each of the memory areas 102, 104, 106, and 108 includes a plurality of memory cells. Read, program, or erase operations can be performed on a memory unit basis. Thus, each memory unit can include a predetermined number of memory cells. The memory cells in a memory area 102, 104, 106, or 108 can be included in a single memory die or in multiple memory dice.

The memory cells in each of memory areas 102, 104, 106, and 108 can be arranged in rows and columns in the memory units. Each of the memory units can be a physical unit. For example, a group of a plurality of memory cells can form a memory unit. Each of the memory units can also be a logical unit. For example, the memory unit can be a bank, block, or page that can be identified by a unique address such as bank address, block address, and page basis address. During a read or write operation, the unique address associated with a particular memory unit can be used to access that particular memory unit. Based on the unique address, information can be written to or retrieved from one or more memory cells in that particular memory unit.

The memory cells in the memory areas 102, 104, 106, and 108 can include non-volatile memory cells. Examples of non-volatile memory cells include flash memory cells, phase change memory (PRAM) cells, magnetoresistive random-access memory (MRAM) cells, or other types of non-volatile memory cells. In an example implementation where the memory cells are configured as NAND flash memory cells, the read or write operation can be performed on a page basis. However, an erase operation in a NAND flash memory is performed on a block basis.

Each of the non-volatile memory cells can be configured as a single-level cell (SLC) or multiple-level memory cell. A single-level cell can store one bit of information per cell. A multiple-level memory cell can store more than one bit of information per cell. For example, each of the memory cells in the memory areas 102, 104, 106, and 108 can be configured as a multi-level cell (MLC) to store two bits of information per cell, a triple-level cell (TLC) to store three bits of information per cell, or a quad-level cells (QLC) to store four bits of information per cell. In another example, each of the memory cells in memory area 111 can be configured to store at least one bit of information (e.g., one bit of information or multiple bits of information), and each of the memory cells in memory area 112 can be configured to store more than one bit of information.

As shown in FIG. 1, the memory system 100 includes a controller module 120. The controller module 120 includes a memory interface 121 to communicate with the memory module 110, a host interface 126 with communicate with a host (not shown), a processor 124 to executes firmware-level code, and caches and memories 122 and 123 to temporarily or persistently store executable firmware/instructions and associated information. In some implementations, the controller unit 120 can include an error correction engine 125 to perform error correction operation on information stored in the memory module 110. Error correction engine 122 can be configured to detect/correct single bit error or multiple bit errors. In another implementation, error correction engine 125 can be located in the memory module 110.

The host can be a device or a system that includes one or more processors that operate to retrieve data from the memory system 100 or store or write data into the memory system 100. In some implementations, examples of the host can include a personal computer (PC), a portable digital device, a digital camera, a digital multimedia player, a television, and a wireless communication device.

In some implementations, the controller module 120 can also include a host interface 126 to communicate with the host. Host interface 126 can include components that comply with at least one of host interface specifications, including but not limited to, Serial Advanced Technology Attachment (SATA), Serial Attached Small Computer System Interface (SAS) specification, Peripheral Component Interconnect Express (PCIe).

Figure 2:
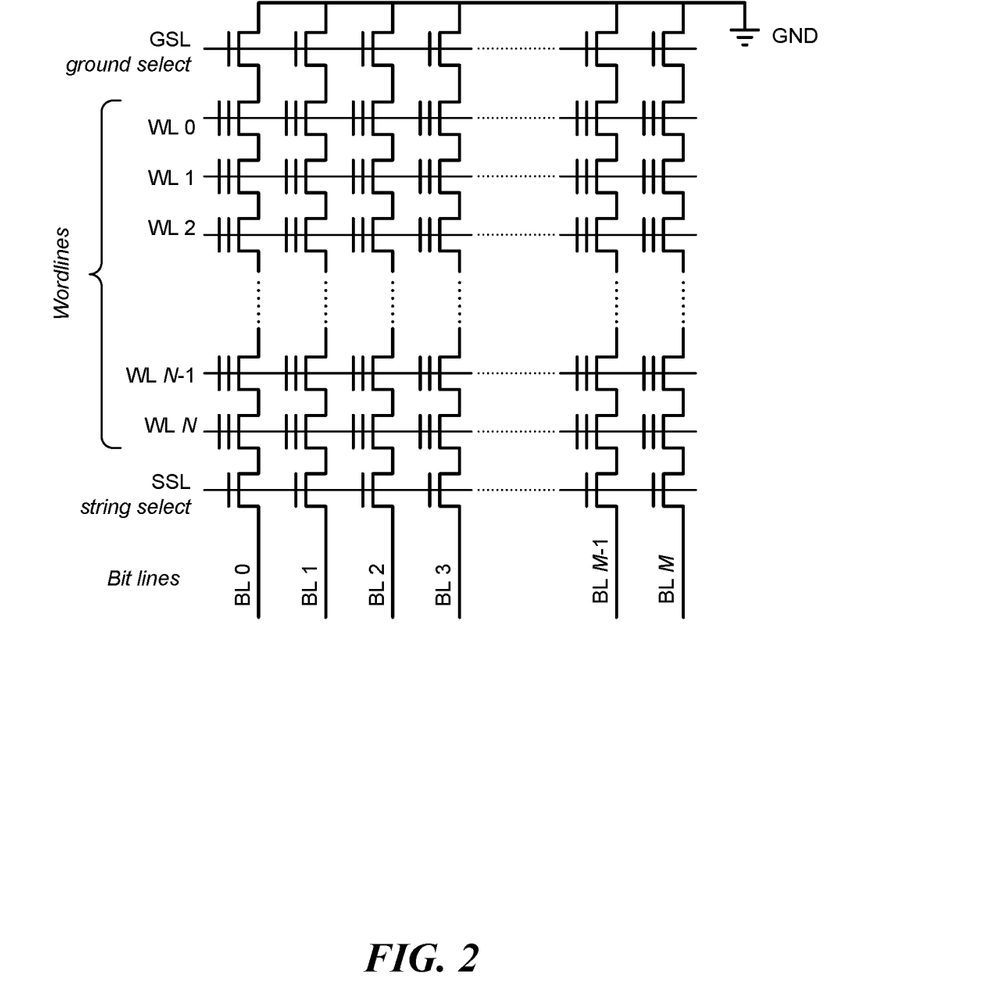
FIG. 2 is an illustration of an example non-volatile memory device.

FIG. 2 illustrates an example of a memory cell array implemented based on some embodiments of the disclosed technology.

In some implementations, the memory cell array can include NAND flash memory array that is partitioned into many blocks, and each block contains a certain number of pages. Each block includes a plurality of memory cell strings, and each memory cell string includes a plurality of memory cells.

In some implementations where the memory cell array is NAND flash memory array, read and write (program) operations are performed on a page basis, and erase operations are performed on a block basis. All the memory cells within the same block must be erased at the same time before performing a program operation on any page included in the block. In an implementation, NAND flash memories may use an even/odd bit-line structure. In another implementation, NAND flash memories may use an all-bit-line structure. In the even/odd bit-line structure, even and odd bit-lines are interleaved along each word-line and are alternatively accessed so that each pair of even and odd bit-lines can share peripheral circuits such as page buffers. In all-bit-line structure, all the bit-lines are accessed at the same time.

Figure 3:
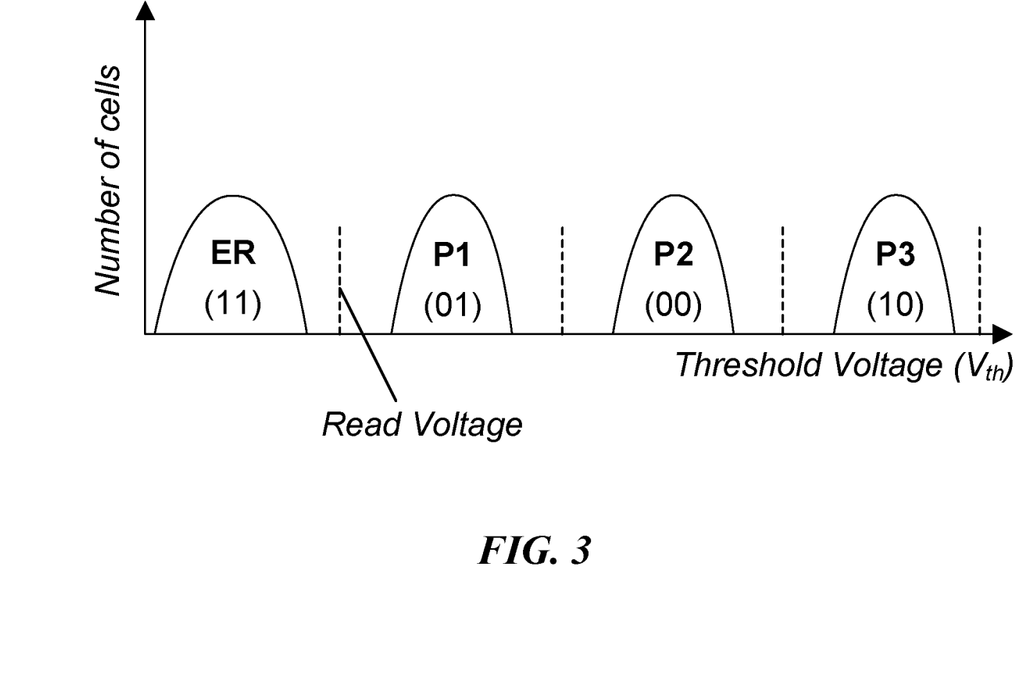
FIG. 3 is an example diagram illustrating the cell voltage level distribution (Vth) of a non-volatile memory device.

FIG. 3 illustrates an example of threshold voltage distribution curves in a multi-level cell device, wherein the number of cells for each program/erase state is plotted as a function of the threshold voltage. As illustrated therein, the threshold voltage distribution curves include the erase state (denoted "ER" and corresponding to "11") with the lowest threshold voltage, and three program states (denoted "P1", "P2" and "P3" corresponding to "01", "00" and "10", respectively) with read voltages in between the states (denoted by the dotted lines). In some embodiments, each of the threshold voltage distributions of program/erase states has a finite width because of differences in material properties across the memory array.

In writing more than one data bit in a memory cell, fine placement of the threshold voltage levels of memory cells is needed because of the reduced distance between adjacent distributions. This is achieved by using incremental step pulse program (ISPP), i.e., memory cells on the same word-line are repeatedly programmed using a program-and-verify approach with a stair case program voltage applied to word-lines. Each programmed state associates with a verify voltage that is used in verify operations and sets the target position of each threshold voltage distribution window.

Read errors can be caused by distorted or overlapped threshold voltage distribution. An ideal memory cell threshold voltage distribution can be significantly distorted or overlapped due to, e.g., program and erase (P/E) cycle, cell-to-cell interference, and data retention errors, which will be discussed in the following, and such read errors may be managed in most situations by using error correction codes (ECC).

Figure 4:
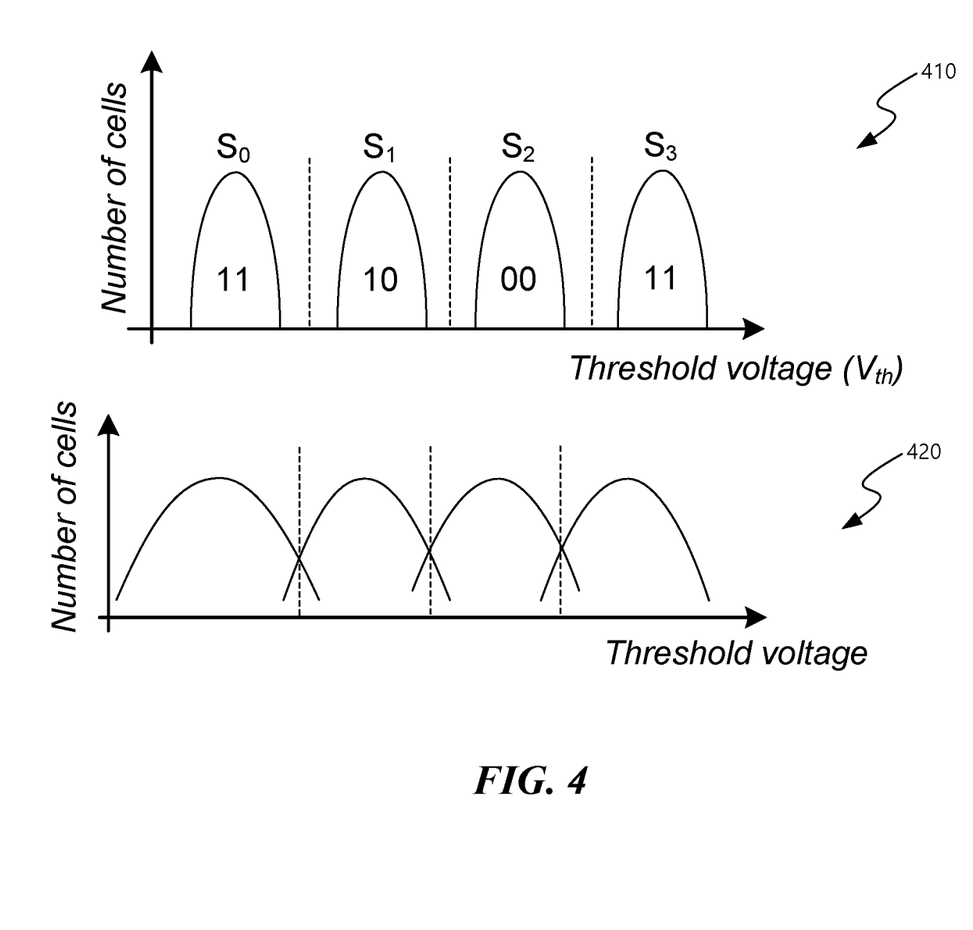
FIG. 4 is another example diagram illustrating the cell voltage level distribution (Vth) of a non-volatile memory device.

FIG. 4 illustrates an example of ideal threshold voltage distribution curves 410 and an example of distorted threshold voltage distribution curves 420. The vertical axis indicates the number of memory cells that has a particular threshold voltage represented on the horizontal axis.

For n-bit multi-level cell NAND flash memory, the threshold voltage of each cell can be programmed to $2^n$ possible values. In an ideal multi-level cell NAND flash memory, each value corresponds to a non-overlapping threshold voltage window.

Flash memory P/E cycling causes damage to a tunnel oxide of floating gate of a charge trapping layer of cell transistors, which results in threshold voltage shift and thus gradually degrades memory device noise margin. As P/E cycles increase, the margin between neighboring distributions of different programmed states decreases and eventually the distributions start overlapping. The data bit stored in a memory cell with a threshold voltage programmed in the overlapping range of the neighboring distributions may be misjudged as a value other than the original targeted value.

Figure 5:
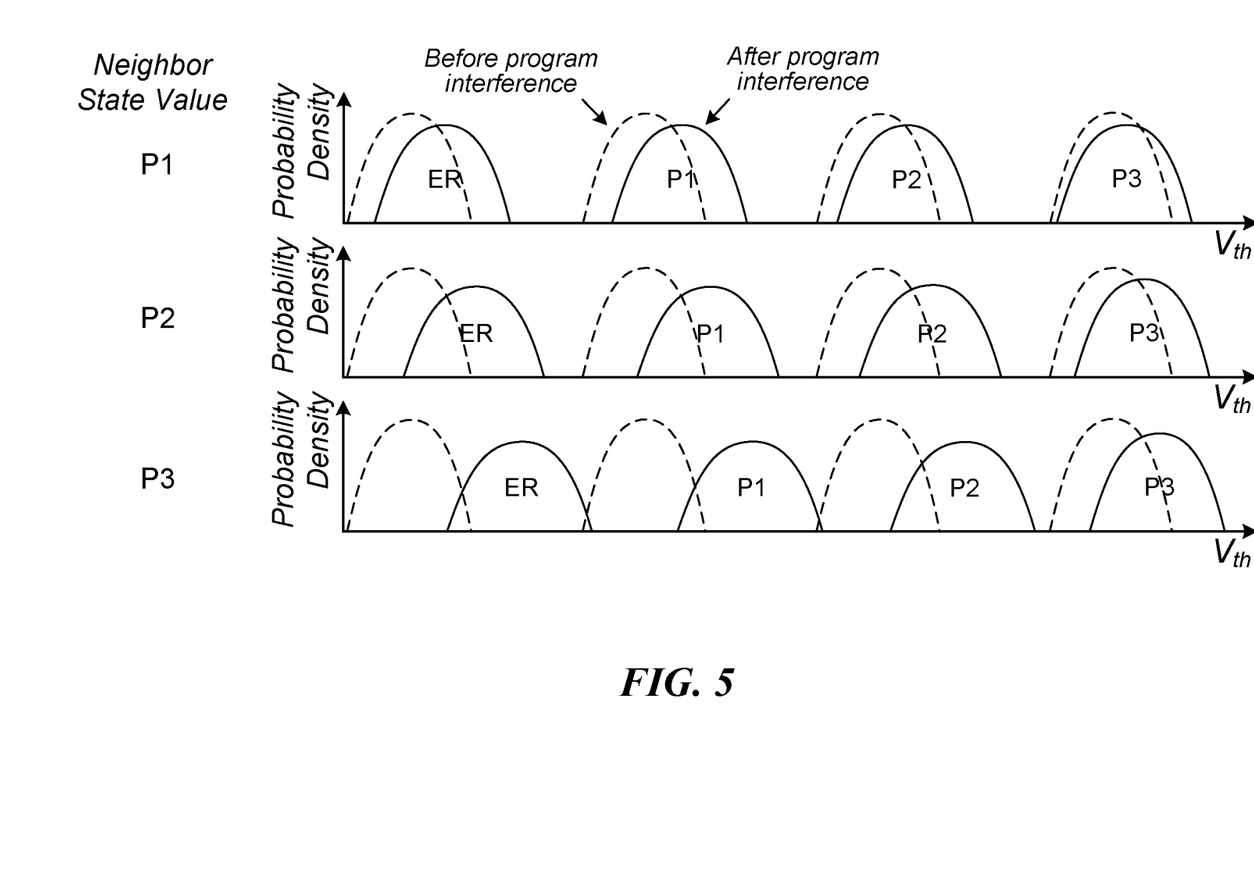
FIG. 5 is an example diagram illustrating the cell voltage level distribution (Vth) of a non-volatile memory device before and after program interference.

FIG. 5 illustrates an example of a cell-to-cell interference in NAND flash memory. The cell-to-cell interference can also cause threshold voltages of flash cells to be distorted. The threshold voltage shift of one memory cell transistor can influence the threshold voltage of its adjacent memory cell transistor through parasitic capacitance-coupling effect between the interfering cell and the victim cell. The amount of the cell-to-cell interference may be affected by NAND flash memory bit-line structure. In the even/odd bit-line structure, memory cells on one word-line are alternatively connected to even and odd bit-lines and even cells are programmed ahead of odd cells in the same word-line. Therefore, even cells and odd cells experience different amount of cell-to-cell interference. Cells in all-bit-line structure suffer less cell-to-cell inference than even cells in the even/odd bit-line structure, and the all-bit-line structure can effectively support high-speed current sensing to improve the memory read and verify speed.

The dotted lines in FIG. 5 denote the nominal distributions of P/E states (before program interference) of the cells under consideration, and the "neighbor state value" denotes the value that the neighboring state has been programmed to. As illustrated in FIG. 5, if the neighboring state is programmed to P1, the threshold voltage distributions of the cells under consideration shift by a specific amount. However, if the neighboring state is programmed to P2, which has a higher threshold voltage than P1, that results in a greater shift compared to the neighboring state being P1. Similarly, the shift in the threshold voltage distributions is greatest when the neighboring state is programmed to P3.

Figure 6:
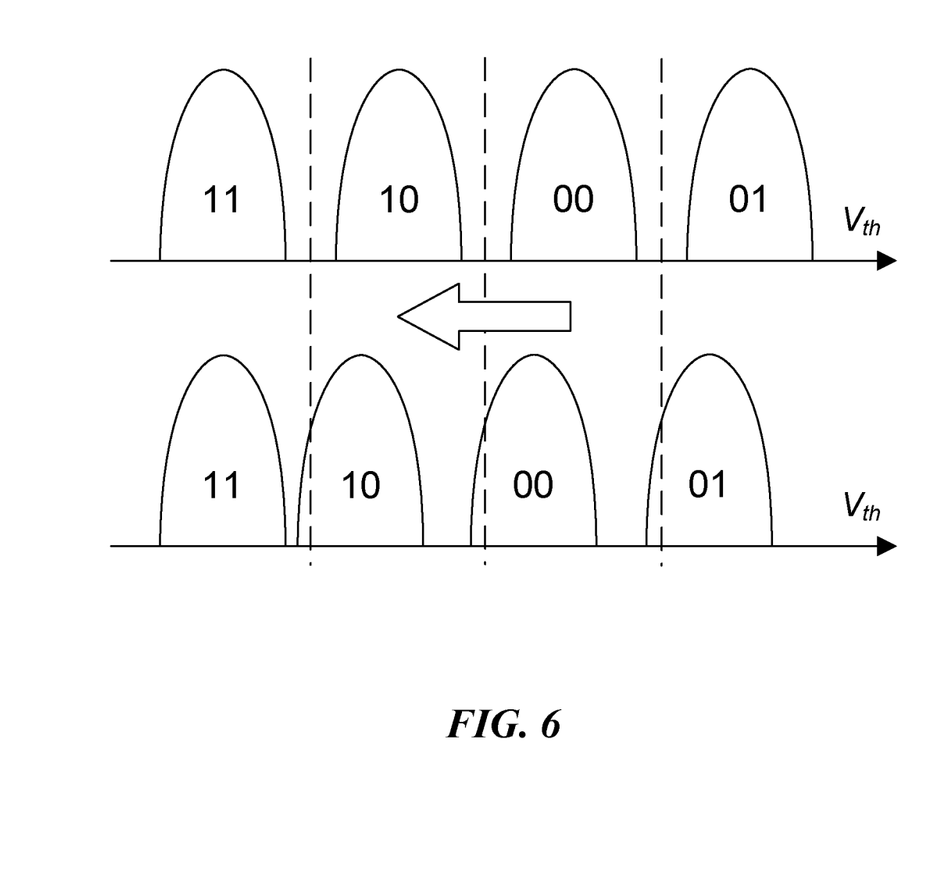
FIG. 6 is an example diagram illustrating the cell voltage level distribution (Vth) of a non-volatile memory device as a function of the reference voltage.

FIG. 6 illustrates an example of a retention error in NAND flash memory by comparing normal threshold-voltage distribution and shifted threshold-voltage distribution. The data stored in NAND flash memories tend to get corrupted over time and this is known as a data retention error. Retention errors are caused by loss of charge stored in the floating gate or charge trap layer of the cell transistor. Due to wear of the floating gate or charge trap layer, memory cells with more program erase cycles are more likely to experience retention errors. In the example of FIG. 6, comparing the top row of voltage distributions (before corruption) and the bottom row of distributions (contaminated by retention error) reveals a shift to the left.

In some embodiments, the retention errors described in FIGS. 5 and 6 (due to, for example, P/E cycling) require using the GLDPC to ensure that the bits that are stored are read correctly. However, implementing the component codes of a GLDPC using SISO algorithms typically entails a high level of complexity. Embodiments of the disclosed technology reduce the complexity of a SISO Hamming decoder, while maintaining good error correction performance, by selecting the decoding output candidates using both the syndrome and the channel information.

Figure 7:
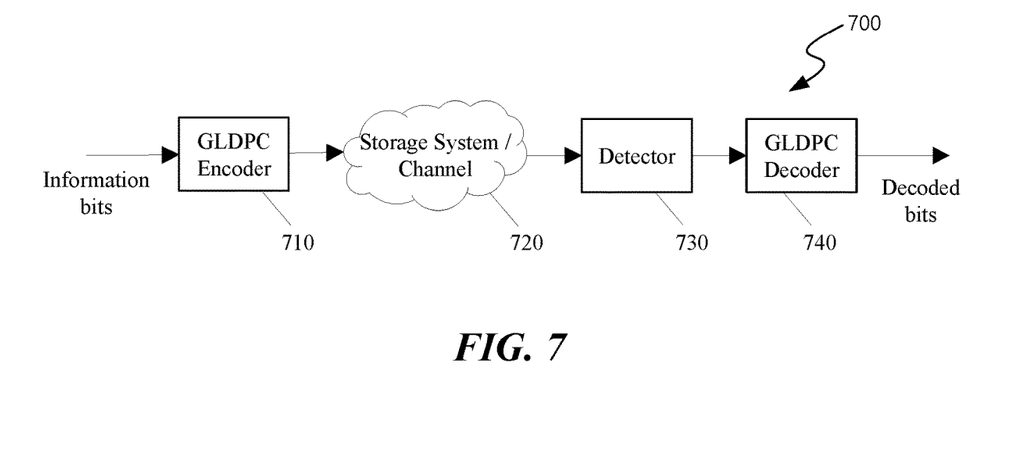
FIG. 7 is a high-level block diagram of a generalized low-density parity-check (G-LDPC) error correcting system.

FIG. 7 illustrates an example high level block diagram of an error correcting system 700, in accordance with some embodiments of the present disclosure. In the example, GLDPC codes are described in connection with data storage. However, the embodiments of the present disclosure are not limited as such. Instead, the embodiments similarly apply to other usage of GLDPC codes including, for example, data transmission.

As illustrated in FIG. 7, a GLDPC encoder 710 receives information bits that include data which is desired to be stored in a storage system 720. GLDPC encoded data (e.g., GLDPC codewords) is output by the GLDPC encoder 710 and is written to the storage 720.

In various embodiments, the storage 720 may include a variety of storage types or media such as (e.g., magnetic) disk drive storage, Flash storage, etc. In some embodiments, the techniques are employed in a transceiver and instead of being written to or read from storage, the data is transmitted and received over a wired and/or wireless channel. In this case, the errors in the received codeword may be introduced during transmission of the codeword.

When the stored data is requested or otherwise desired (e.g., by an application or user which stored the data), a detector 730 receives data from the storage system 720. The received data may include some noise or errors. The detector 730 performs detection on the received data and outputs decision and/or reliability information. For example, a soft output detector outputs reliability information and a decision for each detected bit. On the other hand, a hard output detector outputs a decision on each bit without providing corresponding reliability information. As an example, a hard output detector may output a decision that a particular bit is a "1" or a "0" without indicating how certain or sure the detector is in that decision. In contrast, a soft output detector outputs a decision and reliability information associated with the decision. In general, a reliability value indicates how certain the detector is in a given decision.

The decision and/or reliability information is passed to a GLDPC decoder 740 which performs GLDPC decoding using the decision and reliability information. A soft input decoder utilizes both the decision and the reliability information to decode the codeword. A hard decoder utilizes only the decision values in the decoder to decode the codeword. In many situations, the decoding is iterative and the GLDPC decoder 740 includes a plurality of constituent decoders, each of which may be a hard decoder or a soft decoder. For example, a BCH decoder can be used for hard decoding each constituent codeword when such constituent codewords are BCH codes. In addition or in the alternative, a maximum a posteriori probability (MAP) decoder can be used for soft decoding each of the constituent codewords. The decoded bits generated by the GLDPC decoder 740 are passed to the appropriate entity (e.g., the user or application which requested it). With proper encoding and decoding, the information bits match the decoded bits.

In an example, consider a Hamming code with code length n, information length k, and minimum distance d. The parameter satisfies [n, k, d]=[$2^m$-1, $2^m$-1-m, m], where m is a positive integer. In the context of FIG. 7, a Hamming codeword is denoted as c, which the transmitter sends as the modulated codeword x over the additive white Gaussian noise (AWGN) channel. The received signal is y=x+n, where n is the Gaussian noise. The receiver then estimates the bit sequence c̃ from the received signal y. In some embodiments, this may be achieved by calculating the the syndrome based on y. For a fixed syndrome, all the possible error patterns are collected, and then the most M possible error patterns which are closest neighbors of the received signal y are chosen.

In an example, a (7,4,3) Hamming code is used to elucidate certain features and aspects of the disclosed technology. It is assumed that the syndrome of a distorted bit sequence of a (7,4,3)-Hamming code is z=(0 0 1). Thus, the possible error patterns are collected in matrix E with element $e_{i,j}$:

```
0 0 0 0 0 0 1
1 0 1 0 0 0 0
0 1 0 0 0 1 0
0 0 0 1 1 0 0
1 1 0 0 1 0 0
1 0 0 1 0 1 0
0 1 1 1 0 0 0
0 0 1 0 1 1 0
...
```

Then, for all the error patterns (each row in the error pattern matrix E), the nearest M neighbors of the received signal y are chosen instead of choosing the error patterns with the least hard error numbers. In an example, the M neighbors with the smallest non-Hamming distance are selected. In an example, any distance metric that excludes the Hamming distance may be used to select the nearest M neighbors. If the channel (e.g., 720 in FIG. 7) between the encoder and the decoder is the AWGN channel, then the distance used to select the nearest M neighbors is the Euclidean distance. If the channel is non-Gaussian, then the distance is a non-Euclidean distance but excludes the Hamming distance.

In some embodiments, the reliability for each error pattern in the matrix is calculated. In an example, the reliability may be the probability, log likelihood rate (LLR), and so on. If the reliability is larger than a first threshold Ts, it is chosen as a decode-output candidate, and its corresponding error patterns in matrix E is marked. In an example, when the sum of the reliability of all the candidates is larger than a second threshold Ta, the search is terminated, and the set of M error patterns to be analyzed has been ascertained.

In an example, let $P_i$ denote the probability values multiplied column-wise for the given error pattern of every row i. Among these M error patterns, the probability is calculated as:

$$\hat{P}_i = \prod_j \begin{cases} P(\tilde{c}_j = c_j | y_j) & \text{if } e_{i,j} = 0 \\ 1 - P(\tilde{c}_j = c_j | y_j) & \text{if } e_{i,j} = 1 \end{cases}.$$

And after normalization, the probability is computed as:

$$P_i = \hat{P}_i \bigg/ \left( \sum_{i'} \hat{P}_{i'} \right).$$

For the j-th bit, the probability $P_i$ of x=1 of all the patterns is summed, and for the i-th row, the following probability is computed:

$$\hat{P}(x_j = +1 | y) = \sum_{\substack{i \\ e_{i,j} = \tilde{c}_j}} P_i.$$

And subsequently, the log likelihood ratio (LLR) can be computed as:

$$LLR = \log\left( \frac{\hat{P}(x_j = 1)}{1 - \hat{P}(x_j = 1)} \right).$$

Figure 8:
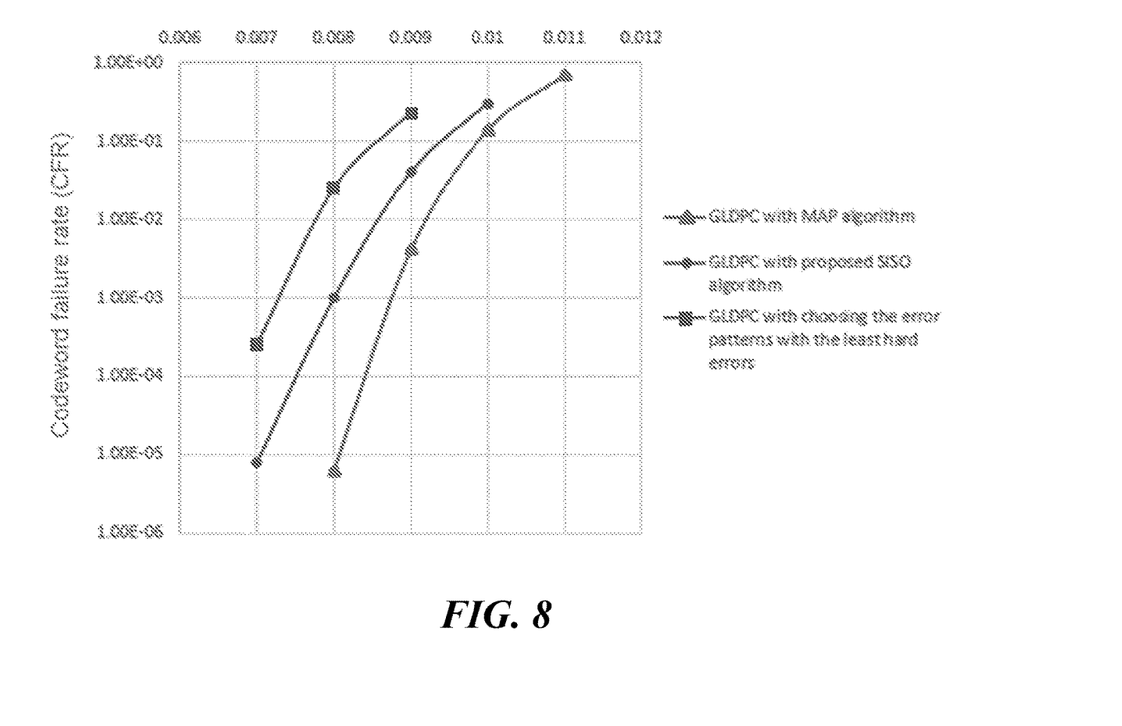
FIG. 8 is an example performance plot comparing the codeword failure rate (CFR) for a GLDPC code in a binary symmetric channel (BSC).

FIG. 8 is an example performance plot comparing the codeword failure rate (CFR) for a GLDPC code in a binary symmetric channel (BSC). In the example illustrated in FIG. 8, the GLDPC component code is a (63, 57) Hamming code with M=652. As seen therein, the performance of the disclosed technology (with circle markers) with quadratic complexity approaches the performance of the MAP algorithm (with triangle markers) with exponential complexity. The GLDPC that selects error patterns with the least hard errors (with square markers) has the same complexity as some of the described herein, but worse performance.

Figure 9:
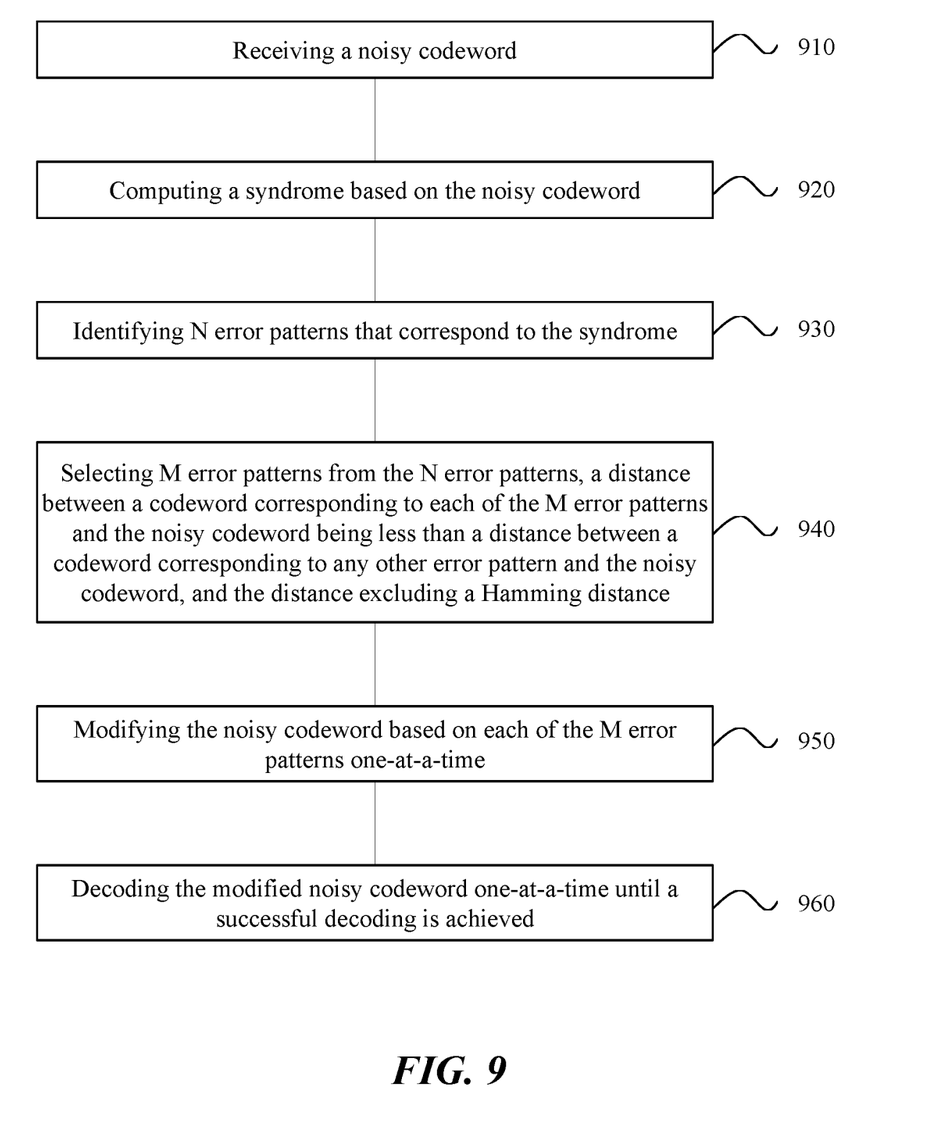
FIG. 9 illustrates a flowchart of another example method for improved decoding of a binary linear code.

FIG. 9 illustrates a flowchart of a method 900 for improved decoding of a binary linear code. The method 900 includes, at operation 910, receiving a noisy codeword. In an example, a noisy codeword is a codeword that has been affected circuit-level noise, which may be additive white Gaussian noise (AWGN) or non-Gaussian, or a combination thereof. In another example, the noisy codeword is a codeword that has been contaminated with errors, thereby resulting in a value of one of the bits flipping from "1" to "0", or vice versa.

The method 900 includes, at operation 920, computing a syndrome based on the noisy codeword.

The method 900 includes, at operation 930, identifying N error patterns that correspond to the syndrome.

The method 900 includes, at operation 940, selecting M error patterns from the N error patterns, wherein M≤N are positive integers, wherein M is less than or equal to N, wherein a distance between a codeword corresponding to each of the M error patterns and the noisy codeword is less than a distance between a codeword corresponding to any other error pattern and the noisy codeword, and wherein the distance excludes a Hamming distance.

The method 900 includes, at operation 950, modifying the noisy codeword based on each of the M error patterns one-at-a-time.

The method 900 includes, at operation 960, decoding the modified noisy codeword one-at-a-time until a successful decoding is achieved.

In some embodiments, the binary linear code is a (n, k, d) Hamming code that is a component code of a generalized low-density parity-check (G-LDPC) code. In an example, n=7, k=3 and d=3.

In some embodiments, the distance is a Euclidean distance. In other embodiments, the distance is a non-Euclidean distance that is different from the Hamming distance.

In some embodiments, selecting the M error patterns from the N error patterns comprises the operations of calculating a reliability metric for each of the N error patterns; and selecting an error pattern of the M error patterns based on a comparison of the reliability metric of the error pattern and a first threshold. In an example, the reliability metric is a log-likelihood ratio. In another example, the reliability metric is a probability. In yet another example, selecting the M error patterns from the N error patterns is further based on a comparison of a sum of the reliability metric of each of the M error patterns and a second threshold.

In some embodiments, M is a predetermined value. In an example, if two codewords have the same reliability metric and only one of them can be included in the M error patterns, one of the two codewords may be chosen randomly. Alternatively, the codeword with the smaller (or greater) index may be selected. In other embodiments, M can be increased to select both codewords with the same reliability metric.

In some embodiments, the value of M may be selected to trade-off performance for complexity, and vice versa. For example, using a higher value of M improves performance since more candidate error patterns are analyzed, but this increases complexity. Alternatively, using a smaller M will reduce the computational complexity, but may results in slightly degraded performance if the correct error pattern is not selected.

In some embodiments, achieving the successful decoding corresponds to a successful read operation in a non-volatile memory. In an example, the non-volatile memory is a NAND flash memory.

Implementations of the subject matter and the functional operations described in this patent document can be implemented in various systems, digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing unit" or "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of nonvolatile memory, media and memory devices, including by way of example semiconductor memory devices, e.g., EPROM, EEPROM, and flash memory devices. The processor and the memory can be supplemented by, or incorporated in, special purpose logic circuitry.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A method for improved decoding of a binary linear code, comprising:

receiving a noisy codeword;

computing a syndrome based on the noisy codeword;

identifying N error patterns that correspond to the syndrome;

selecting M error patterns from the N error patterns, wherein N and M are positive integers, wherein M is less than or equal to N, wherein a distance between a codeword corresponding to each of the M error patterns and the noisy codeword is less than a distance between a codeword corresponding to any other error pattern and the noisy codeword, and wherein the distance excludes a Hamming distance;

modifying the noisy codeword based on each of the M error patterns one-at-a-time; and decoding the modified noisy codeword one-at-a-time until a successful decoding is achieved.

2. The method of claim 1, wherein the binary linear code is a (n, k, d) Hamming code that is a component code of a generalized low-density parity-check (G-LDPC) code.

3. The method of claim 2, wherein n=7, k=3 and d=3.

4. The method of claim 1, wherein the distance is a Euclidean distance.

5. The method of claim 1, wherein selecting the M error patterns from the N error patterns comprises:
calculating a reliability metric for each of the N error patterns; and
selecting an error pattern of the M error patterns based on a comparison of the reliability metric of the error pattern and a first threshold.

6. The method of claim 5, wherein the reliability metric is a log-likelihood ratio.

7. The method of claim 5, wherein the reliability metric is a probability.

8. The method of claim 5, wherein selecting the M error patterns from the N error patterns is further based on a comparison of a sum of the reliability metric of each of the M error patterns and a second threshold.

9. The method of claim 1, wherein achieving the successful decoding corresponds to a successful read operation in a non-volatile memory.

10. The method of claim 9, wherein the non-volatile memory is a NAND flash memory.

11. A system for improved decoding of a binary linear code, comprising:
a processor and a memory including instructions stored thereupon, wherein the instructions upon execution by the processor cause the processor to:
receive a noisy codeword;
compute a syndrome based on the noisy codeword;
identify N error patterns that correspond to the syndrome;
select M error patterns from the N error patterns, wherein N and M are positive integers, wherein M is less than or equal to N, wherein a distance between a codeword corresponding to each of the M error patterns and the noisy codeword is less than a distance between a codeword corresponding to any other error pattern and the noisy codeword, and wherein the distance excludes a Hamming distance;
modify the noisy codeword based on each of the M error patterns one-at-a-time; and
decode the modified noisy codeword one-at-a-time until a successful decoding is achieved.

12. The system of claim 11, wherein the binary linear code is a (7, 4, 3) Hamming code that is a component code of a generalized low-density parity-check (G-LDPC) code.

13. The system of claim 11, wherein the instructions upon execution by the processor further cause the processor, as part of selecting the M error patterns from the N error patterns, to:
calculate a reliability metric for each of the N error patterns; and
select an error pattern of the M error patterns based on a comparison of the reliability metric of the error pattern and a first threshold.

14. The system of claim 13, wherein the reliability metric is a probability or a log-likelihood ratio.

15. The system of claim 13, wherein selecting the M error patterns from the N error patterns is further based on a comparison of a sum of the reliability metric of each of the M error patterns and a second threshold.

16. The system of claim 11, wherein the distance is a Euclidean distance.

17. A non-transitory computer-readable storage medium having instructions stored thereupon for improved decoding of a binary linear code, comprising:
instructions for receiving a noisy codeword;
instructions for computing a syndrome based on the noisy codeword;
instructions for identifying N error patterns that correspond to the syndrome;
instructions for selecting M error patterns from the N error patterns, wherein N and M are positive integers, wherein M is less than or equal to N, wherein a distance between a codeword corresponding to each of the M error patterns and the noisy codeword is less than a distance between a codeword corresponding to any other error pattern and the noisy codeword, and wherein the distance excludes a Hamming distance;
instructions for modifying the noisy codeword based on each of the M error patterns one-at-a-time; and
instructions for decoding the modified noisy codeword one-at-a-time until a successful decoding is achieved.

18. The storage medium of claim 17, wherein the binary linear code is a (7, 4, 3) Hamming code that is a component code of a generalized low-density parity-check (G-LDPC) code.

19. The storage medium of claim 17, wherein the instructions for selecting the M error patterns from the N error patterns comprises:
instructions for calculating a reliability metric for each of the N error patterns; and
instructions for selecting an error pattern of the M error patterns based on a comparison of the reliability metric of the error pattern and a first threshold.

20. The storage medium of claim 19, wherein the reliability metric is a probability or a log-likelihood ratio.

21. The storage medium of claim 19, wherein selecting the M error patterns from the N error patterns is further based on a comparison of a sum of the reliability metric of each of the M error patterns and a second threshold.

22. The storage medium of claim 17, wherein achieving the successful decoding corresponds to a successful read operation in a NAND flash memory.

* * * * *